(12) United States Patent
Marz

(10) Patent No.: US 6,731,165 B1
(45) Date of Patent: May 4, 2004

(54) ELECTRONIC AMPLIFIER

(76) Inventor: Daniel J. Marz, 13130 Camino Ramillette, San Diego, CA (US) 92128

( * ) Notice: Subject to any disclaimer, the term of this patent is extended or adjusted under 35 U.S.C. 154(b) by 0 days.

(21) Appl. No.: 10/337,675

(22) Filed: Jan. 6, 2003

(51) Int. Cl.[7] .............................. H03F 3/68; H03F 3/45; H03F 1/26; H03F 1/00
(52) U.S. Cl. ........................ 330/85; 330/257; 330/149; 330/151
(58) Field of Search .......................... 330/85, 257, 149, 330/151

(56) References Cited

U.S. PATENT DOCUMENTS

| | | |
|---|---|---|
| 1,686,792 A | 10/1928 | Black |
| 4,023,046 A | 5/1977 | Renirie |
| 4,028,634 A | 6/1977 | Tentarelli |
| 4,122,402 A | 10/1978 | Main |
| 4,322,688 A | 3/1982 | Schlotzhauer et al. |
| 4,523,152 A | 6/1985 | Garde |
| 4,571,553 A | 2/1986 | Yokoyama |
| 4,879,521 A | 11/1989 | Bredemann et al. |
| 4,987,379 A | 1/1991 | Hughes |
| 5,041,795 A | 8/1991 | Bowers |
| 5,103,188 A | 4/1992 | Bender |
| 5,276,405 A | 1/1994 | Mazzucco et al. |
| 5,410,282 A | 4/1995 | Larrick et al. |
| 5,442,318 A | 8/1995 | Badyal et al. |
| 5,519,310 A | 5/1996 | Bartlett |
| 5,736,900 A | 4/1998 | Smith |
| 5,889,393 A * | 3/1999 | Wrathall ..................... 323/282 |
| 5,990,737 A | 11/1999 | Czarnul et al. |
| 6,127,888 A | 10/2000 | Kokubo |
| 6,163,216 A | 12/2000 | Murray et al. |
| 6,222,418 B1 | 4/2001 | Gopinathan et al. |
| 6,329,876 B1 | 12/2001 | Llewellyn |
| 6,411,163 B1 | 6/2002 | Enriquez |
| 6,411,164 B1 | 6/2002 | Enriquez |
| 6,441,685 B1 | 8/2002 | MacMillan |
| 6,476,674 B2 | 11/2002 | Smedegaard-Pedersen et al. |

OTHER PUBLICATIONS

US 2003/0058044 A1 of Candy, Amplifier Improvements.*
Hood, John Linsley, Audio Electronics, 1995, pp. 225–227, Newness, Oxford.

* cited by examiner

Primary Examiner—Patricia Nguyen
(74) Attorney, Agent, or Firm—Timothy N. Ellis

(57) ABSTRACT

An amplifier that accurately amplifies signals over a wide bandwidth, including DC, has a voltage-to-current converter, a feed-forward resistive element, a buffer, an input resistive element, a feedback resistive element, and an operational amplifier. A first end of the feed-forward resistive element is coupled to an output of the voltage-to-current converter and to an input of the buffer. A first end of the input resistive element is coupled to an input to the voltage-to-current converter. A first end of the feedback resistive element is coupled to an output of the buffer. An inverting input of the operational amplifier is coupled to a second end of the input resistive element and to a second end of the feedback resistive element. A noninverting input of the operational amplifier is coupled to ground, and an output of the operational amplifier is coupled to a second end of the feed-forward resistive element.

26 Claims, 8 Drawing Sheets

ELECTRONIC AMPLIFIER

BACKGROUND

1. Technical Field (Field of the Invention)

The present invention relates to electronic amplifiers. More particularly, the invention concerns an electronic amplifier that has fast DC settling for providing accurate amplification at low frequencies.

2. Description of Related Art

Power amplifiers are widely used electronic devices. Power amplifiers can be used, for example, as audio, servo (motor control), or instrumentation amplifiers. Ideally, a power amplifier produces an output signal at a load that is identical to an input signal, except that the power of the output signal is greater than the power of the input signal. (Pout=Vout*Iout)>(Pin=Vin*Iin). In many applications it is desirable to have a power amplifier that has a frequency response which is substantially flat down to DC, for amplifying signals that include very low frequencies (for example, frequencies below 20 Hz), or DC.

Amplifiers commonly utilize feedback to reduce errors caused, for example, by inaccurate components, component mismatches, and power supply issues. A prior art:design for an amplifier circuit 100 that utilizes feedback is illustrated in FIG. 1. The amplifier circuit 100 has an input 101 and an output 102, and includes an amplifier 103, a resistor 104, an operational amplifier 106, a capacitor 108, and an adder 109. The amplifier 103 has an input 110 and an output 111. The operational amplifier 106 has an inverting input 112, a noninverting input 113, and an output 114. The adder 109 has an inverting input 116, a noninverting input 118, and an output 120. The prior art amplifier circuit 100 utilizes feedback implemented with a DC servo loop that includes the resistor 104, the operational amplifier 106, and the capacitor 108. To prevent degradation of the low frequency response of the amplifier circuit 100, the frequency response of the servo loop must be considerably lower than the minimum frequency that is to be amplified by the amplifier circuit 100. In many applications, for example audio amplifiers and servo amplifiers, this characteristic of DC servo loop feedback amplifiers and the general inability of DC servo loop feedback amplifiers to be used to amplify DC signals, is a serious disadvantage. The amplifier circuit 100 has the further disadvantage of producing a DC offset at the output 102, in response to an AC input signal that has a DC component at the input 101.

Feed-forward error correction is another technique that can be utilized in amplifier circuits to reduce output errors. However, a feed-forward amplifier circuit typically includes one or more filters to improve the AC characteristics of the amplifier. Filters are typically implemented with a capacitor or with another frequency dependent circuit element. A disadvantage of including a filter in an amplifier circuit is that the filter generally will degrade the low frequency response of the amplifier.

For circuits that can be implemented in integrated circuits, accurate component matching can be utilized to reduce errors caused by component mismatches. However this technique is not available for power amplifiers, due to voltage and current limitations of integrated circuits, which prevent implementing power amplifiers on integrated circuits.

In summary, existing designs are inadequate for implementing a power amplifier that can accurately amplify low frequency signals.

SUMMARY

An illustrative embodiment of the present invention concerns an amplifier circuit that provides accurate amplification over a range of frequencies including very low frequencies, and DC. The amplifier circuit includes an input and an output, a voltage-to-current converter, a feed-forward resistive element, a buffer, an input resistive element, a feedback resistive element, and an operational amplifier. The voltage-to-current converter has an output, and an input that is coupled to the input of the amplifier circuit. The feed-forward resistive element has a first end and a second end. The first end of the feed-forward resistive element is coupled to the output of the voltage-to-current converter. The buffer has an output that is coupled to the output of the amplifier circuit, and an input that is coupled to the first end of the feed-forward resistive element. The input resistive element has a first end and a second end. The first end of the input resistive element is coupled to the input of the amplifier circuit. The feedback resistive element has a first end and a second end, and the first end of the feedback resistive element is coupled to the output of the amplifier circuit. The operational amplifier has an inverting input, a noninverting input, and an output. The inverting input is coupled to the second end of the input resistive element and to the second end of the feedback resistive element. The noninverting input is coupled to ground, an,d the output of the operational amplifier is coupled to the second end of the feed-forward resistive element.

Another aspect of the invention is a method for amplifying a voltage. Illustrative examples of various aspects of the invention are described in the sections below.

The invention provides a number of advantages, including the ability to accurately-amplify electronic signals that include very low frequency and DC components. The invention also provides a number of other advantages and benefits, which should be apparent from the following description.

DETAILED DESCRIPTION

Figure 1:
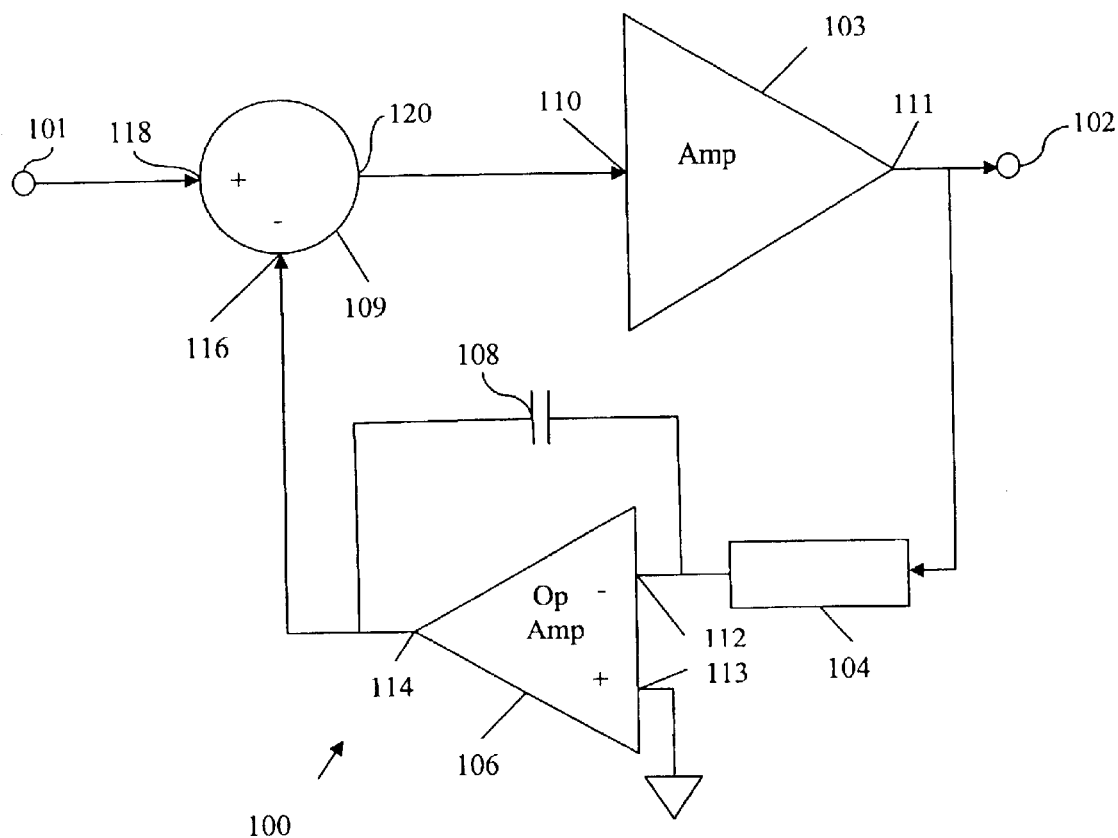
FIG. 1 is a block diagram of an amplifier circuit in accordance with the prior art.

The nature, objectives, and advantages of the invention will become more apparent to those skilled in the art after considering the following detailed description in connection with the accompanying drawings.

I. HARDWARE COMPONENTS AND INTERCONNECTIONS

A. First Example of Amplifier

One aspect of the invention concerns an electronic amplifier. As an example, the electronic amplifier may be embodied by the amplifier circuit 200 shown in FIG. 2. The amplifier circuit 200 includes an amplifier input node 202, which may be referred to as a power amplifier input, and an amplifier output node 204, which may be referred to as a power amplifier output. The amplifier circuit also includes a voltage-to-current converter 206 that has an input 208 and an output 210. The output 210 of the voltage-to-current converter 206 generates a current I1 that is proportional to the input voltage at the input 208 of the V/I converter 206. The input 208 of the voltage-to-current converter 206 is coupled to the input node 202. The voltage-to-current converter 206 may be referred to as a high voltage V/I converter. The amplifier circuit 200 also includes a feed-forward impedance element 212 that has a first end 214 and a second end 216. The first end 214 of the feed-forward impedance element 212 is coupled to the output 210 of the voltage-to-current converter 206. The voltage-to-current converter 206 may convert a relatively small voltage at the input 208 to the voltage-to-current converter 206, into a relatively large current that flows through the feed-forward impedance element 212, to produce a voltage V/I across the feed-forward impedance element 212 that is larger than the voltage at the input 208 to the voltage-to-current converter 206.

The amplifier circuit 200 also includes a buffer 218 that has an input 220 and an output 222. The output 222 of the buffer 218 is coupled to the amplifier output node 204, and the input 220 of the buffer 218 is coupled to the first end 214 of the feed-forward impedance element 212. The amplifier circuit 200 also includes an error amplifier input impedance element 224 having a first end 226 and a second end 228. The first end 226 of the error amplifier input impedance element 224 is coupled to the input 208 of the voltage-to-current converter 206. The amplifier circuit 200 further includes a feedback impedance element 230 having a first end 232 and a second end 234. The first end 232 of the feedback impedance element 230 is coupled to the output 222 of the buffer 218. The amplifier circuit 200 also includes an error amplifier 236 that has an inverting input 238, a noninverting input 240, and an output 242. The inverting input 238 is coupled to the second end 228 of the error amplifier input impedance element 224 and to the second end 234 of the feedback impedance element 230, and the output 242 of the error-amplifier 236 is coupled to the second end 216 of the feed-forward impedance element 212. An error amplifier input voltage is produced at the inverting input 238 of the error amplifier 236. An error amplifier output voltage V2 is produced at the output 242 of the error amplifier 236, which is feed-forward, through the feed-forward impedance element 212, to the input 220 of the buffer 218. Utilization of the error amplifier output voltage V2 results in a reduction of distortion in the signal at the amplifier output node 204. The total voltage at the input 220 of the buffer 218 is the sum of the voltage V1 generated across the feed-forward impedance element 212 by the current I1, and the error amplifier output voltage V2.

Although not required, the noninverting input 240 of the error amplifier 236 is typically coupled to ground 244, to optimize common mode rejection.

The amplifier circuit 200 may also include a buffer input node 246 coupled to the buffer input 220, and an error amplifier output node 248 coupled to the output 242 of the error amplifier 236.

The feed-forward impedance element 212, the error amplifier input impedance element 224, and the feedback impedance element 230 could be frequency-dependent capacitive or inductive components, but for most applications will have impedances that are substantially resistive with only parasitic capacitance and/or inductance. When the impedances are substantially resistive, the feed-forward impedance element 212, the error amplifier input impedance element 224, and the feedback impedance element 230 may be referred to respectively as the feed-forward resistive element, the error amplifier input resistive element, and the feedback resistive element. The feed-forward impedance element 212, the error amplifier input impedance element 224, and the feedback impedance element 230 are each typically resistors. When implemented with a resistor, the value of the feed-forward impedance element 212 may be in a range from about 500 ohms to about 20 k ohms, and will typically be in a range from about 1 k ohms to about 5 k ohms, and as an example, may have a value of about 2.2 k ohms. When implemented with a resistor, the value of the error amplifier input impedance element 224 may be in a range from about 1 k ohms to about 100 k ohms, and will typically be in a range from about 3 k ohms to about 30 k ohms, and as an example, may have a value of about 10 k ohms. When implemented with a resistor, the value of the feedback impedance element 230 may be in a range from about 2 k ohms to about 1M ohms, and will typically be in a range from about 3 k ohms to about 300 k ohms, and as an example, may have a value of about 68 k ohms.

When the feed-forward impedance-element 212, the error-amplifier input impedance element 224, and the feedback impedance element 230 are each substantially resistive, the amplifier circuit 200 does not include any filters or integrators (which can degrade performance), and consequently the amplifier circuit 200 provides the advantages of fast DC settling and accurate amplification of signals over a wide, frequency bandwidth, including low frequencies and DC. Consequently, the amplifier circuit 200 is well suited for many applications, including, for example, audio, servo, and instrumentation applications.

The error amplifier 236 typically is an operational amplifier, and, for example, may be a commercially available operational amplifier integrated circuit. Suitable operational amplifier integrated circuits include model number OPA 604 manufactured by Texas Instruments, and model number NE5532 which is generally available from several manufacturers. Alternatively, the operational amplifier may be implemented with discrete components. Thus, the amplifier circuit 200 may advantageously utilize a relatively inexpensive, low voltage, low power, operational amplifier having good AC and DC characteristics, to reduce the error in the output signal at the output 204 of the higher voltage, higher power, amplifier circuit 200.

Although not required, typically the amplifier circuit 200 will be implemented as a power amplifier. The output of the buffer 222 may be configured to generate any value of output power generally realizable by an output buffer, and could generate, for example, about, 10, 50, 100, 200, 400, 1,000 or more watts of peak output power, and typically will be designed to generate between about 50 and about 300 watts peak of output power. Output voltages at the output 204 of the amplifier circuit 200 may range from about 20V peak to about 150V peak, however, smaller or larger peak voltages could be produced. The output current at the output 204 of the amplifier circuit 200 may range from about 1A peak to about 100A peak, however, smaller or larger peak currents could be produced. The input signal at the input 202 to the amplifier circuit 200 may range from about 10 mV peak to about 10V peak, and will typically be between about 1V peak and about 3V peak. The voltage gain of the amplifier circuit 200 may be, for example, in a range from about 10 to about 50, but also may be less than 10 or greater than 50. The amplifier circuit 200 of the present invention is characterized by a good low frequency response, and consequently, the −3 dB passband of the amplifier circuit 200 typically will include low frequencies, for example, 0 Hz (DC), 1mHz, 0.1 Hz, 1 Hz, 10 Hz, 15 Hz and/or 20 Hz. As an example, the −3 dB passband of the amplifier circuit 200 may be from about 1 Hz to about 130 KHz.

The voltage at the input node 202 may be referred to as V1, the voltage at the output node 204 may be referred to as Vout, the voltage generated by the current I1 at the buffer input node 246 may be referred to as V1, the voltage at the error amplifier output node 248 may be referred to as V2, the transconductance of the voltage-to-current converter 206 may be referred to as −k, and the gain of the buffer 218 may be referred to as G. The value of k may be in a range from about 1 mA/V to about 50 mA/V, and as an example, may be about 10 mA/V. The value of G may be in a range from about 0.5 to about 30, and as an example, may be about 1. The input impedance of the buffer 218 will generally be much larger than the resistance Rg of the feed-forward impedance element 212. The output 242 of the error amplifier 236, the output 210 of the voltage-to-current converter 206, the input 220 of the buffer 218, and the feed-forward resistive element 212 interact such that V1 is effectively added to V2 so that the voltage at the buffer input node 246 is the sum of the voltages V1 and V2. The output buffer 218 generates an output voltage at the power amplifier output 204 that is substantially proportional to the sum of the voltages V1 and V2. Herein the word "proportional" is used broadly to include a signal having the same magnitude, larger magnitude, or smaller magnitude, and/or the same or different phase. An output signal at the output 204 of the amplifier circuit 200 will have a phase that is substantially opposite to the phase of an input signal at the input 202 to the amplifier circuit 200.

Figure 2:
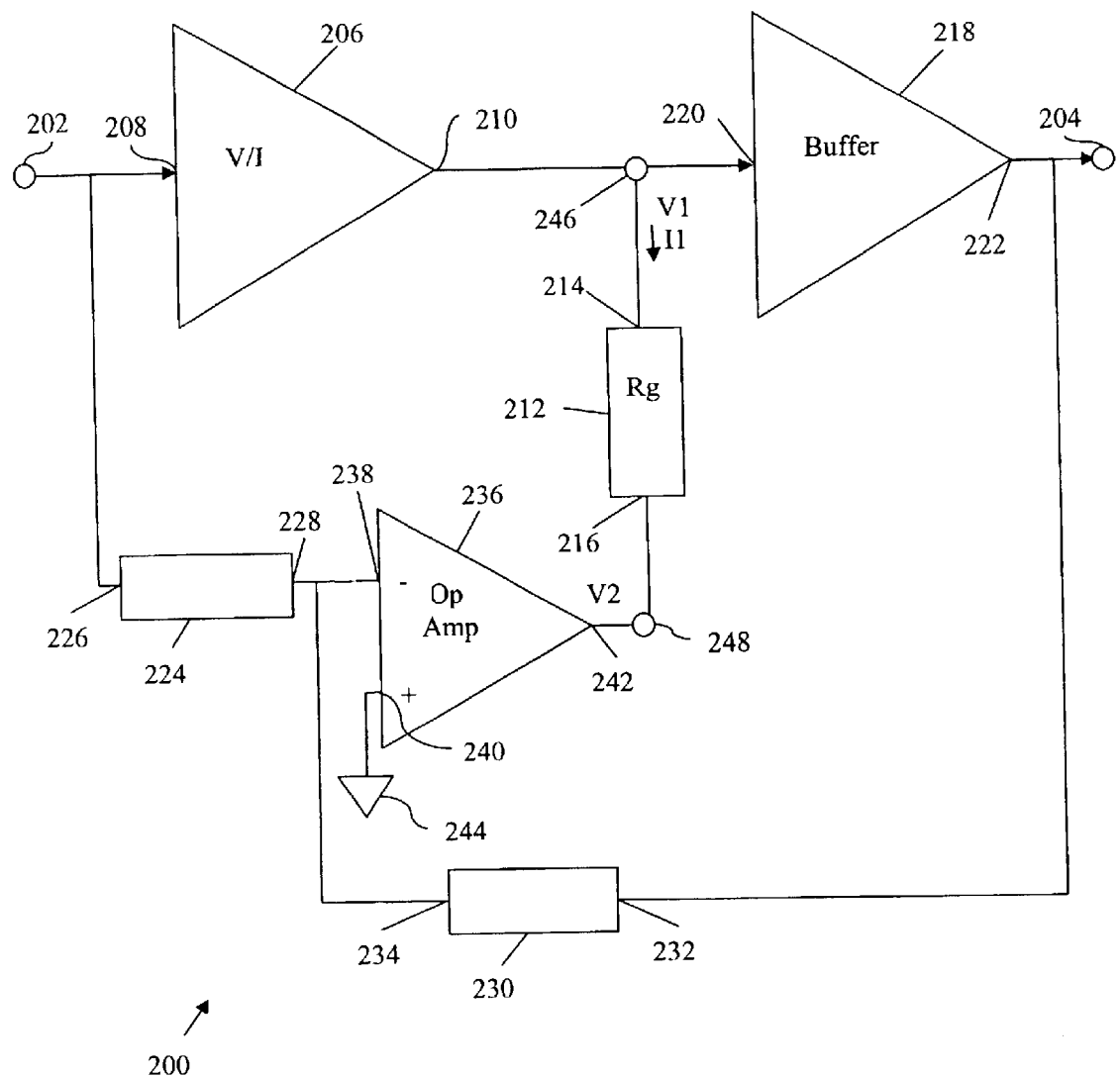
FIG. 2 is a block diagram of an amplifier circuit in accordance with an illustrative .embodiment of he invention.

With reference to FIG. 2:

$I1=-k*Vin$ $V1=(-I1*Rg)+V2$ $Vout=G*V1=-(G*I1*Rg)+(G*V2)=-(G*k*Vin*Rg)+(G*V2)$

Also, $Vout=-(R2/R1)*Vin$

So, $-(R2/R1)*Vin=-(G*k*Vin*Rg)+(G*V2)$

And if, $R2/R1=*G*Rg$

Then, $V2=0$

Due to the imperfections of circuit components, the voltage-to-current converter 206 and/or the buffer 218 may introduce errors into the output signal at the output node 204 of the amplifier circuit 200. These errors can include gain errors, DC offset, distortion, and/or other types of errors. These errors can be modeled as an error current Ie added to I1. In this case:

$I1=(-k*Vin)+Ie$ $V1=(-I*Rg)+(Ie*Rg)+V2$ $Vout=G*V1=-(G*I1*Rg)+(G*((Ie*Rg)+V2))=-(G*k*Vin*Rg)+(G*((Ie*Rg)+V2))$ Also, $Vout=-(R2/R1)*Vin$ So, $-(R2/R1)*Vin=-(G*k*Vin*Rg)+(G*((Ie*Rg)+V2)$ And if, $R2/R1=G*k*Rg$ Then $V2=-Ie*Rg$ Consequently, the architecture of the amplifier circuit 200 reduces the error in the output signal at the output node 204 of the amplifier circuit 200, while providing good AC and DC characteristics.

Figure 3:
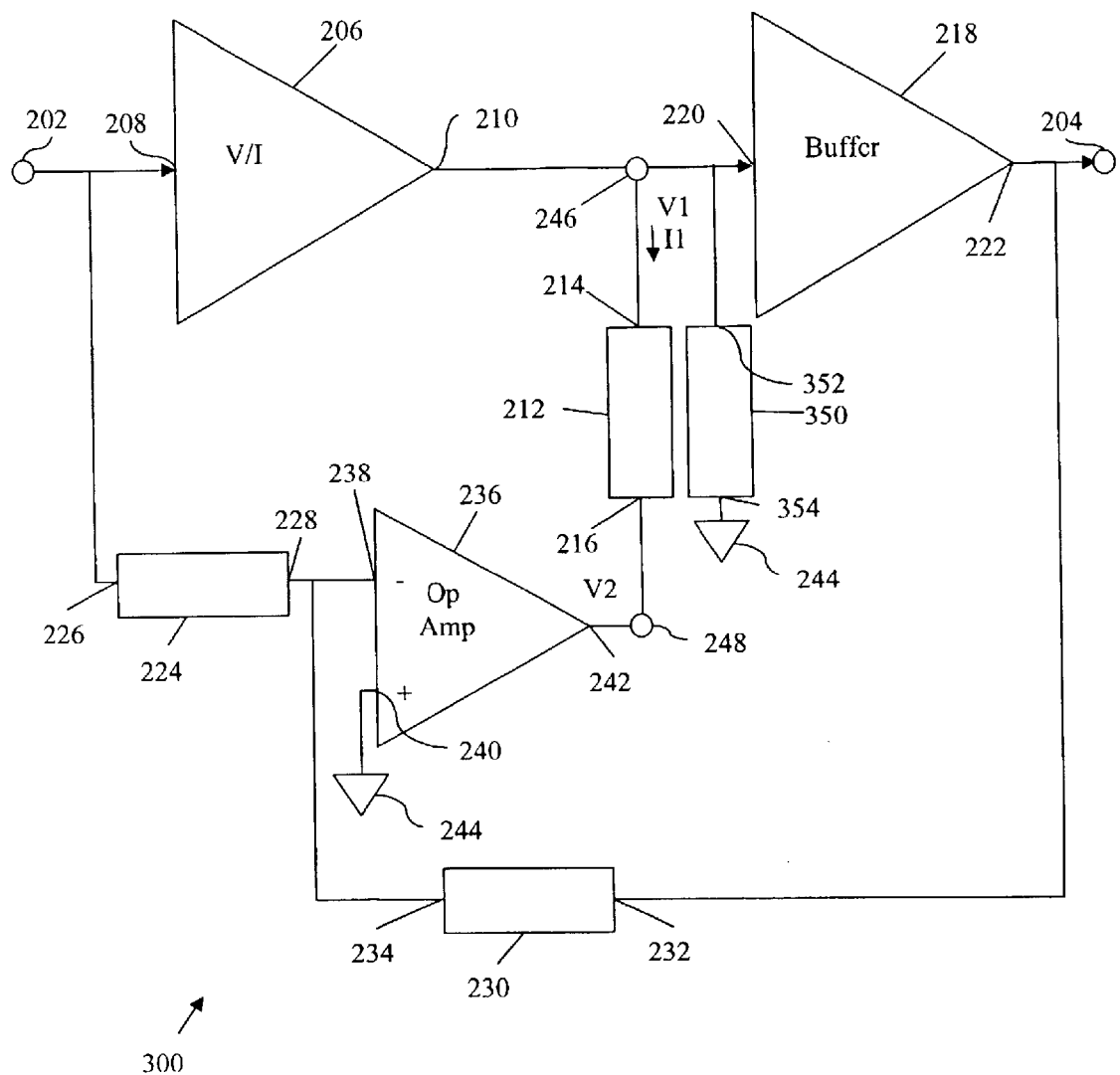
FIG. 3 is a block diagram of an amplifier circuit in accordance with another illustrative embodiment of he invention.

The amplifier circuit may also include a correction limiting resistive element 350 that has a first end 352 and a second end 354, as illustrated by the amplifier circuit 300 in FIG. 3. In some embodiments the element 350 may be replaced with a combination of resistive and non resistive elements, for example, capacitive, inductive, and/or active elements. The first end 352 of the correction limiting resistive element 350 is coupled to the output 210 of the voltage-to-current converter 206, and the second end 354 of the correction limiting resistive element 350 is coupled to ground 244. The correction limiting resistive element 350 provides an alternative current path to ground 344 and thereby limits the amount of error correction caused by the error amplifier output voltage V2.

B. Second Example of Amplifier

Figure 4:
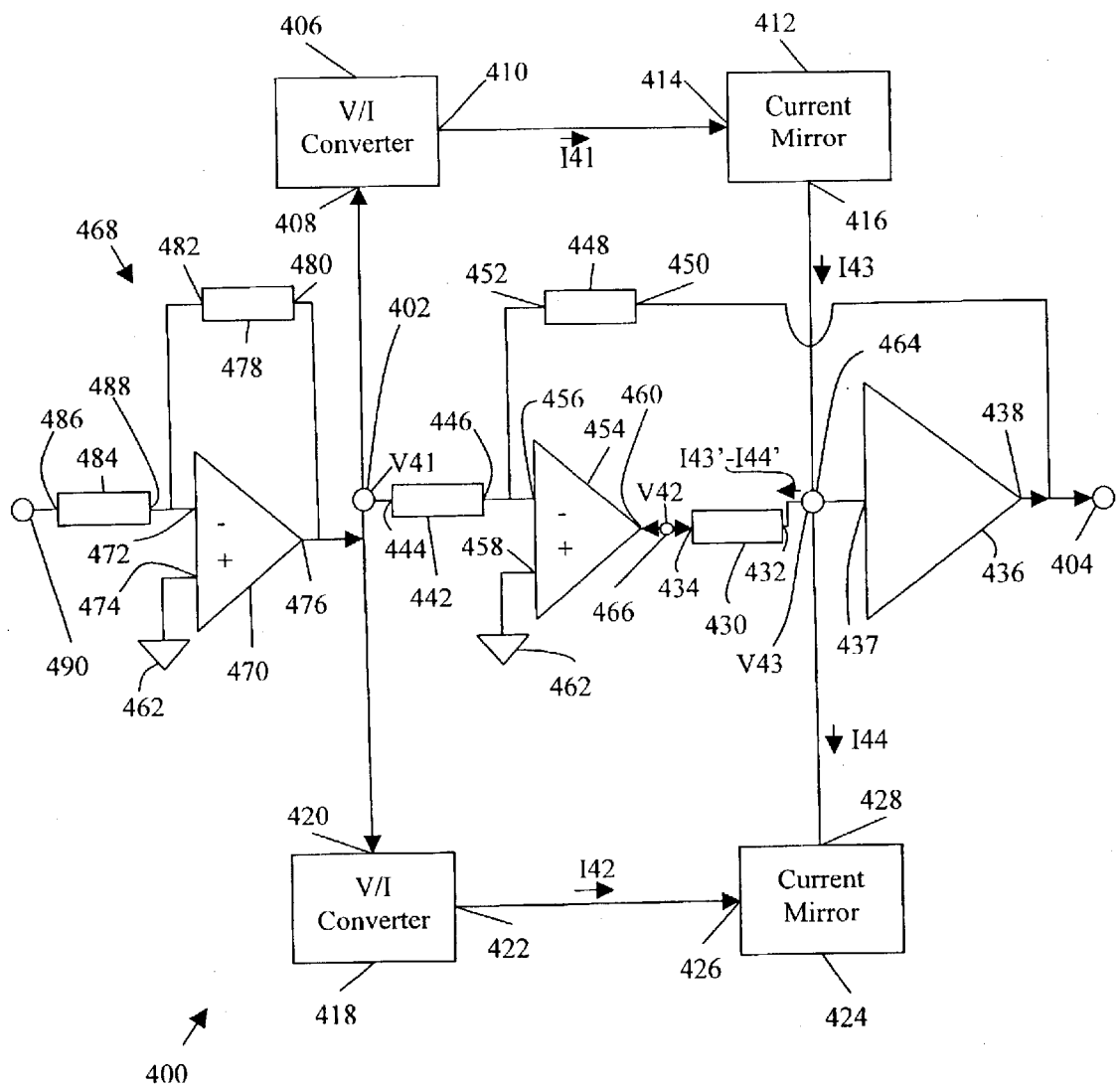
FIG. 4 is a block diagram of an amplifier circuit in accordance with another illustrative embodiment of he invention.

The amplifier circuit 400 illustrated in FIG. 4 is an example of another embodiment of the invention. The amplifier circuit 400 includes an amplifier input node 402, which may be referred to as an input node or as a power amplifier input, and an amplifier output node 404, which may be referred to as an output node or as a power amplifier output. The amplifier circuit 400 includes a first voltage-to-current converter 406 that has an input 408 and an output 410. The input 408 of the first voltage-to-current converter 406 is coupled to the input node 402. The output 410 of the first voltage-to-current converter 406 generates a current I41 (which may be referred to as a first intermediate current), that is proportional to the input voltage V41 at the input node 402. The amplifier circuit 400 also includes a first current mirror 412 that has an input 414 and an output 416. The input 414 of the first current mirror 412 is coupled to the output 410 of the first voltage-to-current converter 406. The output 416 of the first current mirror 412 generates a current I43 that is proportional to the input voltage at the input node 402, wherein the, current I43 has a polarity that is opposite to the polarity of the current I41. The amplifier circuit 400 also includes a second voltage-to-current converter 418 that has an input 420 and an output 422. The input 420 of the second voltage-to-current converter 418 is coupled to the input node 402. The output 422 of the second voltage-to-current converter 418 generates a current I42 (which may be referred to as a second intermediate current), that is proportional to the input voltage at the input node 402. The polarity of the current I42 is opposite to the polarity of the current I41. The amplifier circuit 400 also includes a second current mirror 424 that has an input 426 and an output 428. The input 426 of the second current mirror 424 is coupled to the output 422 of the second voltage-to-current converter 418. The output 428 of the second current mirror 424 generates a current I44 that is proportional to the input voltage at the input node 402, wherein the current I44 has a polarity that is opposite to the polarity of the current I42 and opposite to the polarity of the current I43. This arrangement of using two current mirrors in a balanced circuit configuration beneficially,reduces power dissipation and reduces even-order distortion.

Additionally, the amplifier circuit 400 includes a feed-forward resistive element 430 that has a first end 432 and a second end 434, and a buffer 436 that has an input 437 and an output 438. The buffer 436 may also be referred to as an output buffer. The output 438 of the buffer 436 is coupled to the amplifier output node 404, and the input 437 of the buffer 436 is coupled to the first end 432 of the feed-forward resistive element 430. The output 416 of the first current mirror 412 and the output 428 of the second current mirror 424 are coupled to the first end 432 of the feed forward resistive element 430 and to the input 437 of the buffer 436. Currents I43' and I44' flow through the feed-forward resistive element 430 to generate a voltage V43 at the first end 432 of the feed-forward resistive element 430 that is proportional to I43' minus I44'. Due to some current loss at the input 437 of the buffer 436, current I43' is slightly smaller than current I43, and current I44' is slightly smaller than current I44.

The amplifier circuit 400 further includes an input resistive element 442 that has a first end 444 and a second end 446. The first end 444 of the input resistive element 442 is coupled to the input node 402. The amplifier circuit 400 also includes a feedback resistive element 448 that has a first end 450 and a second end 452. The first end 450 of the feedback resistive element 448 is coupled to the output 438 of the buffer 436. The amplifier circuit 400 further includes an operational amplifier 454 that has an inverting input 456, a noninverting input 458, and an output 460. The inverting input 456 is coupled to the second end 446 of the input resistive element 442 and to the second end 452 of the feedback resistive element 448, and the noninverting input 458 is coupled to ground 462. An error amplifier input voltage is produced at the inverting input 456 of the operational amplifier 454. The output 460 of the operational amplifier 454 is coupled to the second end 434 of the feed-forward resistive element 430. An error correction voltage V42 is generated at the output 460 of the operational amplifier 454. The total voltage at the input 437 of the buffer 436 is the sum of the voltage V43 generated across the feed-forward impedance element 430 by the currents I43' and I44', and the error correction voltage V42. The amplifier circuit 400 may also include a buffer input node 464 coupled to the buffer input 437, and an error amplifier output node 466 coupled to the output 460 of the operational amplifier 454.

The amplifier circuit 400 may also include an inverting input buffer 468. The inverting input buffer 468 includes an input buffer operational amplifier 470 that has an inverting input 472, a noninverting input 474, and an output 476. The inverting input buffer 468 also includes a feedback resistor 478 that has a first end 480 that is coupled to the output 476 of the input buffer operational amplifier 470, and that has a second end 482 that is coupled to the inverting input 472 of the input buffer operational amplifier 470. The inverting input buffer 468 also includes an input resistor 484 that has a first end 486 that is coupled to an input buffer input node 490, and a second end 488 that is coupled to the inverting input 472 of the input buffer operational amplifier 470. The noninverting input 474 of the input buffer operational amplifier 470 is coupled to ground 462. The output 476 of the input buffer operational amplifier is coupled to the amplifier input node 402. The inverting input buffer 468 buffers the input to the amplifier circuit 400, and also inverts the input signal so that the signal at the output 404 of the amplifier circuit 400 will not be inverted with respect to the signal at the inverting input buffer input node 490.

The amplifier circuit 400 may also include a correction limiting resistive element (not shown) that has a first end coupled to the first end 432 of the feed-forward resistive element 430, and a second end coupled to ground 462.

C. Voltage-to-Current Converter

Figure 5:
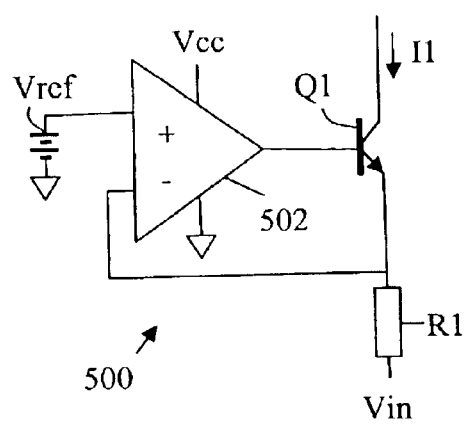
FIG. 5 is a schematic diagram of a V/I converter in accordance with an illustrative embodiment of the invention.

An illustrative embodiment of a voltage-to-current converter (V/I converter) 500 is illustrated in FIG. 5. V/I converter 500 includes an operational amplifier 502, a resistor R1, a transistor Q1, and a voltage reference source Vref. As an example, the operational amplifier 502 may be a model number NE5532, the resistor R1 may have a value of about 2 k ohms, and the value of the reference voltage Vref may be about 0.5 Vcc. Transistor Q1 is chosen to have sufficient beta, and as an example, is a Darlington transistor. As an example, Vcc may be between about 9V and about 15V, however, smaller or larger voltages could be used. In balanced circuits, a negative supply voltage Vee may also be used, which may be between about −9V and about −15V, however, smaller or larger voltages could be used.

Figure 6:
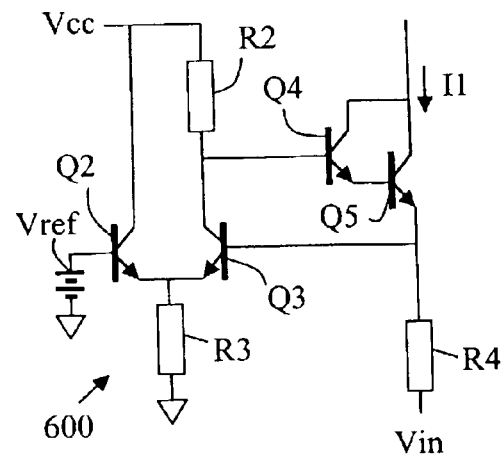
FIG. 6 is another schematic diagram of a V/I converter in accordance with an illustrative embodiment of the invention.

Additional details of an illustrative embodiment of a V/I converter are shown in the V/I converter 600 illustrated in FIG. 6. V/I converter 600 includes resistors R2, R3, and R4, and transistors Q2, Q3, Q4, and Q5. As an example, resistor R2 may have a value of about 10 k ohms, resistor R3 may have a value of about 5 k ohms, and resistor R4 may have a value of about 2 k ohms, and the value of the voltage reference Vref may be about 0.5 Vcc. The transistors are chosen to have sufficient beta, and as an example, transistors Q2 and Q3 are a matched pair and are each Darlington transistors. Alternatively, JFET transistors could be used.

For best performance in the V/I converter circuits, Vref=½ Vcc, and Vin<Vref; then, I1=Vref/R1.

D. Current Mirror

Figure 7:
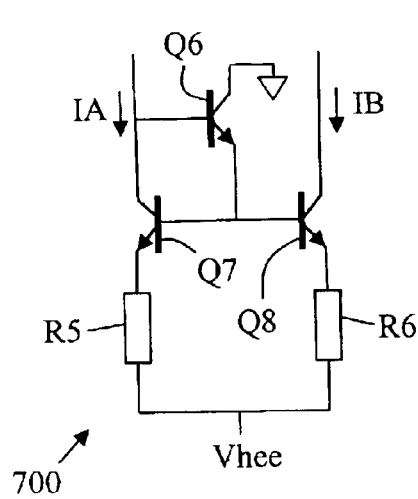
FIG. 7 is a schematic diagram of a current mirror in accordance with an illustrative embodiment of the invention.

An illustrative embodiment of a current mirror circuit 700 is illustrated in FIG. 7. Current mirror 700 includes resistors R5 and R6, and transistors Q6, Q7, and Q8. As an example, resistors R5 and R6 may have values from about 0 ohms to about 1 k ohms, and may have the same value. The voltages across resistors R5 and R6 are substantially equal when the value of resistor R5 equals the value of resistor R6. Current gain can be provided if the values of the resistors R5 and R6 are not the same. The transistors are chosen to have sufficient beta, and as an example, transistors Q7 and Q8 are a matched pair. Transistor Q6 is included to reduce beta errors. As an example, Vee may be about −25V to about −150V, however smaller or larger voltages could be used. The current ratio is: I1*R1=I2*R2; and I2/I1=R1/R2.

E. Output Buffer

Figure 8:
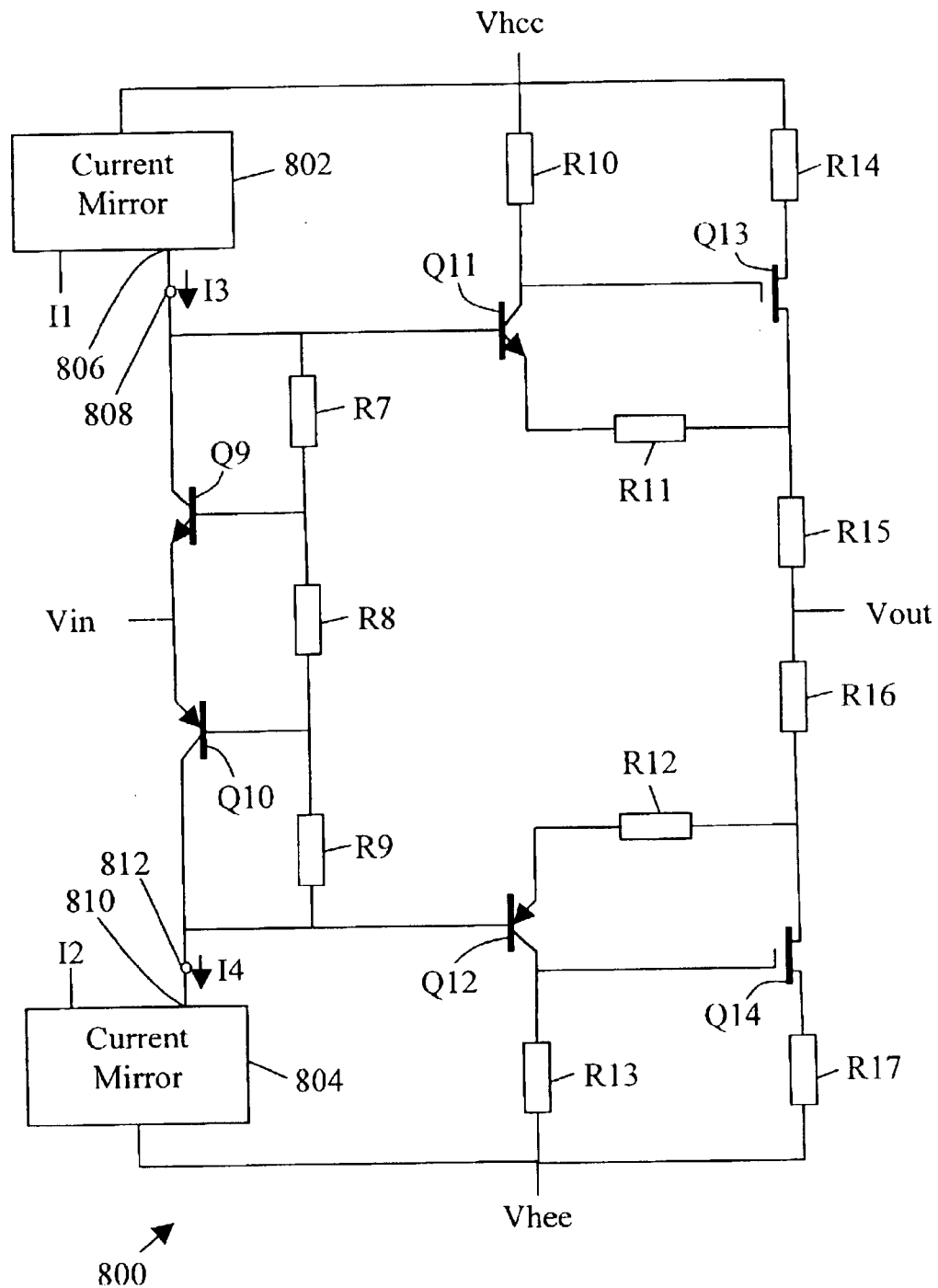
FIG. 8 is a schematic diagram of an output buffer in accordance with an illustrative embodiment of the invention.

An illustrative embodiment of an output buffer circuit 800 is illustrated in FIG. 8. Output buffer 800 is shown coupled to first current mirror 802 and second current mirror 804. Output buffer 800 includes resistors R7, R8, R9, R10, R11, R12, R13, R14, R15, R16, and R17, and transistors Q9, Q10, Q11, Q12, Q13, and Q14. An output 806 of the first current mirror 802 is coupled to a first current input 808 of the output buffer 800. The first current input 808 is coupled to the collector of transistor Q9 and to the base of transistor Q11. An output 810 of the second current mirror 804 is coupled to a second current input 812 of the output buffer 800. The second current input 812 is coupled to the collector of transistor Q10 and to the base of transistor Q12. In the example of the output buffer 800 shown in FIG. 8, the first current mirror 802 and the second current mirror 804 are coupled to an example of bias circuitry in the output buffer 800. The bias circuitry includes transistors Q9 and Q10, and resistors R7, R8, and R9. However, in other embodiments the outputs 806, 810 of the current mirrors 802, 804 do not have to be coupled to bias circuitry, and as shown in the amplifier circuit 400 in FIG. 4, can be coupled to the first end 432 of the feed forward resistive element 430. In some embodiments, bias circuitry can be omitted, or alternatively, bias circuitry can be included but is not coupled to the current mirror outputs. When the outputs 806, 810 of the current mirrors 802, 804 are coupled to bias circuitry, a small portion of the output currents I3 and I4 from the current mirrors 802, 804 are used in the bias circuitry, leaving the remaining portion of the currents from the current mirrors 802, 804 to flow through the feed forward resistive element 430, after flowing through the input Vin of the output buffer.

As an example, R7 may have a value of about 200 ohms, R8 may have a value of about 5 k ohms, R9 may have a value of about 200 ohms, R10 may have a value of about 200 ohms, R11 may have a value of about 15 ohms, R12 may have a value of about 15 ohms, R13 may have a value of about 200 ohms, R14 may have a value of about 0.15 ohms, R15 may have a value of about 0.15 ohms, R16 may have a value of about 0.15 ohms, and R17 may have a value of about 0.15 ohms. Transistors Q9 and Q10 function as bias transistors, transistors Q11 and Q12 function as drivers, and transistors Q13 and Q14 are output power transistors. All of the transistors are chosen to have sufficient beta. As an example, transistors Q11 and Q12 are medium power driver transistors. As an example, output transistors Q13 and Q14 are high voltage, high power transistors. Additional output power transistors may be included in parallel with transistors Q13 and Q14. As an example, Vhcc may be between about 25V and about 150V, and Vhee may be between about −25V and about −150V, however, larger or smaller voltages could be used.

Figure 9A:
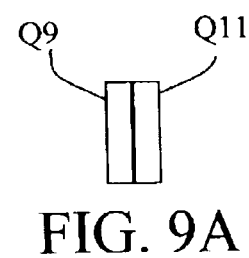
FIG. 9A shows transistors Q9 and Q11 physically attached to each other.
Figure 9B:
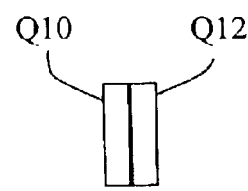
FIG. 9B shows transistors Q10 and Q12 physically attached to each other, in accordance with an illustrative embodiment of the invention.

As an example, transistors Q9 and Q11 are the same part number and are chosen to be as identical as possible. Similarly, as an example, transistors Q10 and Q12 are the same part number and are chosen to be as identical as possible. Transistors Q9 and Q11 may be physically attached to each other, and transistors Q10 and Q12 may be physically attached to each other, so that the temperatures of the attached transistors will be about the same when the transistors heat up during operation, so that the temperature-dependent performance characteristics of the attached transistors will be about the same at any time during operation, such that the operating point of the output stage remains sufficiently constant. FIG. 9A shows an illustrative example of transistors Q9 and Q11 physically attached to each other, and FIG. 9B shows an illustrative example of transistors Q10 and Q12 physically attached to each other.

II. OPERATION

A. First Example of Operation

Figure 10:
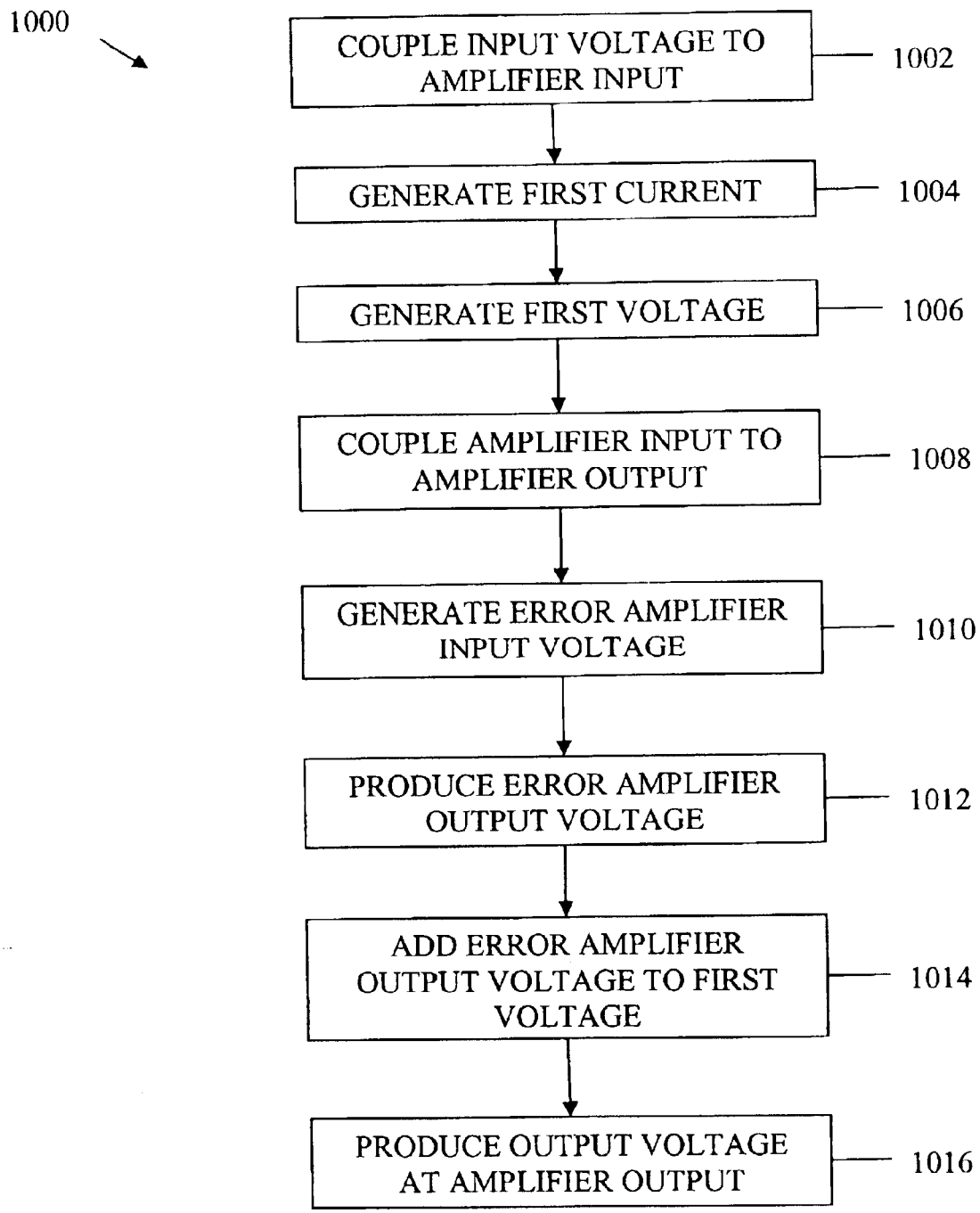
FIG. 10 is a flowchart of an operational sequence for amplifying a voltage in accordance with an illustrative embodiment of the invention.

In addition to the various hardware embodiments described above, a different aspect of the invention concerns a method for amplifying an electronic signal. FIG. 10 shows a sequence 1000 for a method for amplifying a voltage, to illustrate one example of the method aspect of the present invention. For ease of explanation, but without any intended limitation, the example of FIG. 10 is described in the context of the amplifier circuit 200 described above, and wherein the feed-forward impedance element 212, the feedback impedance element 230, and the error amplifier input impedance element 224 are all resistors. The sequence 1000, is initiated with step 1002, wherein an input voltage is coupled to the amplifier input 202. In step 1004, a first current is generated by the V/I converter 206 that is proportional to the input voltage. In step 1006, a first voltage V/I is generated that is proportional to the first current. The first voltage V1 is generated at the first end 214 of the feed-forward impedance element 212, by the current I1 from the output 210 of the V/I converter 206 flowing through the feed-forward impedance element 212. The first voltage V1 and the input voltage at the input node 202 may have opposite polarity. In step 1008, the amplifier input 202 is coupled to the amplifier output 204 through the error amplifier input impedance element 224 and the feedback impedance element 230, wherein the second end 228 of the error amplifier input impedance element 224 and the second end 234 of the feedback impedance element 230 are connected at the inverting input 238 of the error amplifier 236. In step 1010, an error amplifier input voltage is generated at the inverting input 238 of the error amplifier 236 by a current flowing through the error amplifier input impedance element 224 and the feedback impedance element 230. In step 1012 an error amplifier output voltage V2 is produced, wherein the error amplifier output voltage is proportional to the error amplifier input voltage. In step 1014 the error amplifier output voltage V2 is added to the first voltage V1, wherein the first voltage V1 is the voltage generated across the feed-forward impedance element 212 by the current I1. In step 1016, an output voltage is produced by the buffer 218 at the amplifier output 204, wherein the output voltage is substantially proportional to the sum of the error amplifier output voltage V2 and the first voltage V1.

B. Second Example of Operation

Figure 11:
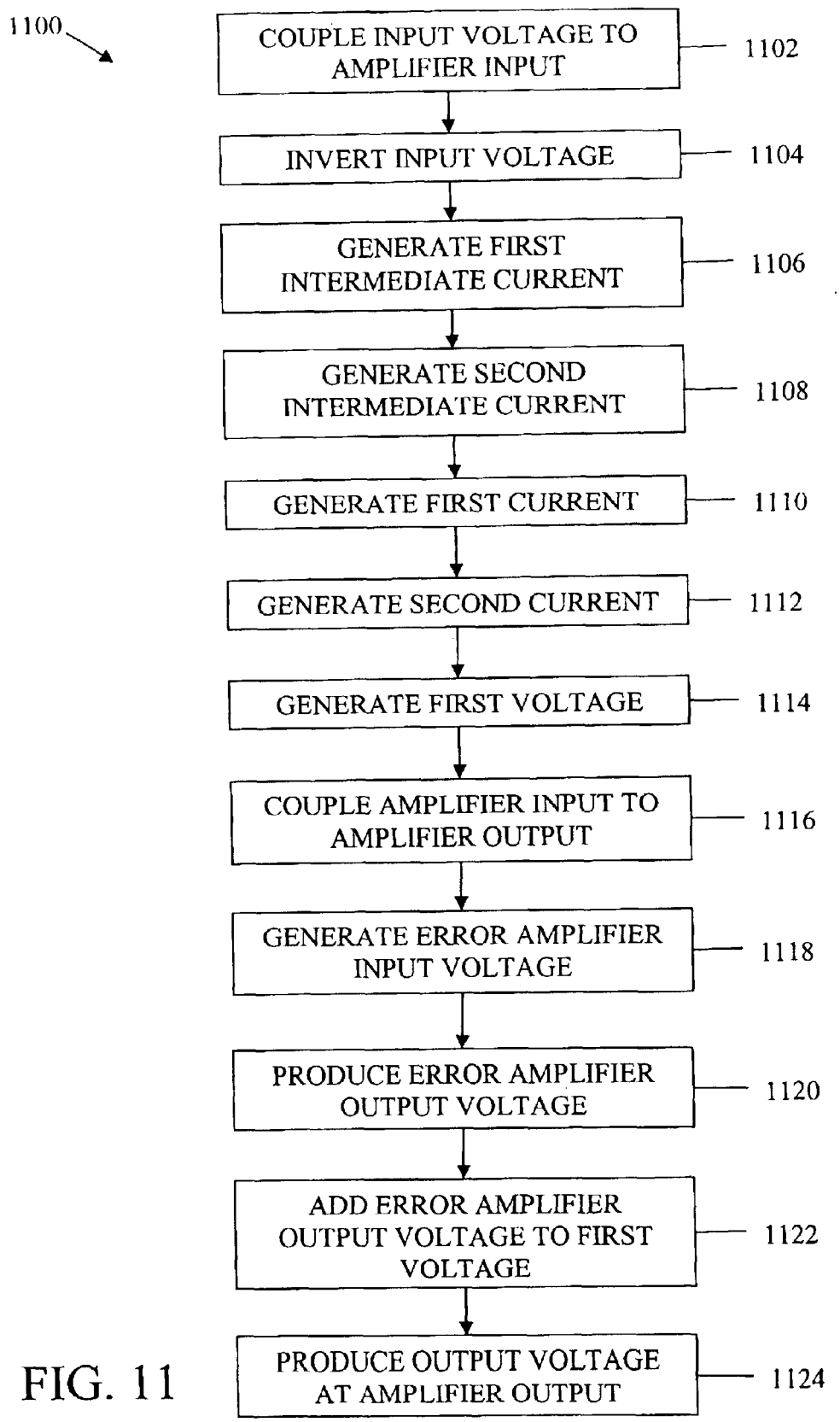
FIG. 11 is a flowchart of another operational sequence for amplifying a voltage in accordance with an illustrative embodiment of the invention.

FIG. 11 shows a sequence 1100 for another method for amplifying a voltage, to illustrate another example of the method aspect of the present invention. For ease of explanation, but without any intended limitation, the example of FIG. 11 is described in the context of the amplifier circuit 400 described above. The sequence 1100, is initiated with step 1102, wherein an input voltage is coupled to the amplifier input node 402.

The sequence 1110 may also include step 1104, in which the input voltage is inverted by utilizing the inverting input buffer 468.

The sequence 1100 may also include steps 1106 and 1108 described as follows. In step 1106, a first intermediate current I41 is generated by the first V/I converter 406, wherein the first intermediate current I41 is proportional to the input voltage. In step 1108, a second intermediate current I42 is generated by the second V/I converter 418, wherein the second intermediate current I42 is proportional to the input voltage.

In step 1110 a first current I43 that is proportional to the input voltage, is generated by the first current mirror 412. The polarity of the first current I43 is opposite to the polarity of the first intermediate current I41. In step 1112, a second current I44 that is proportional to the input voltage, is generated by the second current mirror 424. The polarity of the second current I44 is opposite to the polarity of the first current I43, and is opposite to the polarity of the second intermediate current I42. In step 1114, a first voltage V43 is generated that is substantially proportional to the first current I43 minus the second current I44. The first voltage V43 is generated at the first end 432 of the feed-forward resistive element 430, by the current I43' minus the current I44' flowing through the feed-forward resistive element 430. In step 1116, the amplifier input node 402 is coupled to the amplifier output node, 404 through the input resistive element 442 and the feedback resistive element 448, wherein the second end 446 of the input resistive element 442 and the second end 452 of the feedback resistive element 448 are connected at the inverting input 456 of the operational amplifier 454. In step 1118 an error amplifier input voltage is generated at the inverting input 456 of the operational amplifier 454, by a current flowing through the input resistive element 442 and the feedback resistive element 448. In step 1120, an error amplifier output voltage V42 (the output voltage of the operational amplifier 454) is produced at the output 460 of the operational amplifier 454, wherein the error amplifier output voltage is proportional to the voltage at the inverting input 456 of the operational amplifier 454. In step 1122, the error amplifier output voltage V42 is added to the first voltage V43, by applying the error amplifier output voltage V42 to the second end 434 of the feed-forward resistive element 430. In step 1124, an output voltage is produced by the buffer 436 at the amplifier output node 404, wherein the output voltage is substantially proportional to the sum of the error amplifier output voltage V42 and the first voltage V43.

III. OTHER EMBODIMENTS

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

What is claimed is:

1. An electronic amplifier, comprising:
   a voltage-to-current converter having an input and an output;
   a feed-forward impedance element having a first end and a second end, wherein the first end of the feed-forward impedance element is coupled to the output of the voltage-to-current converter;
   a buffer having an input and an output, wherein the input of the buffer is coupled to the first end of the feed-forward impedance element;
   an error amplifier input impedance element having a first end and a second end, wherein the first end of the error amplifier input impedance element is coupled to the input of the voltage-to-current converter;
   a feedback impedance element having a first end and a second end, wherein the first end of the feedback impedance element is coupled to the output of the buffer; and
   an error amplifier having an inverting input, a noninverting input, and an output, wherein the inverting input is coupled to the second end of the error amplifier input impedance, element and to the second end of the feedback impedance element, and wherein the output of the error amplifier is coupled to the second end of the feed-forward impedance element.

2. The electronic amplifier of claim 1 wherein the error amplifier input impedance element and the feedback impedance element and the feed-forward impedance element have impedances that are substantially resistive.

3. The electronic amplifier of claim 1 wherein the noninverting input of the error amplifier is coupled to ground.

4. The electronic amplifier of claim 1 further comprising a correction limiting resistive element having a first end and a second end, wherein the first end of the correction limiting resistive element is coupled to the output of the voltage-to-current converter, and wherein the second end of the correction limiting resistive element is coupled to ground.

5. The electronic amplifier of claim 1 wherein the output of the buffer can generate at least 25 watts peak of output power.

6. The electronic amplifier of claim 1 wherein the −3 dB passband of the electronic amplifier includes 1 Hz.

7. An amplifier circuit comprising:
   a voltage-to-current converter having an input and an output;
   a feed-forward resistive element having a first end and a second end, wherein the first end of the feed-forward resistive element is coupled to the output of the voltage-to-current converter;
   a buffer having an input and an output, wherein the input of the buffer is coupled to the first end of the feed-forward resistive element;
   an input resistive element having a first end and a second end, wherein the first end of the input resistive element is coupled to the input of the voltage-to-current converter;
   a feedback resistive element having a first end and a second end, wherein the first end of the feedback resistive element is coupled to the output of the buffer; and
   an operational amplifier having an inverting input, a noninverting input, and an output, wherein the inverting input is coupled to the second end of the input-resistive element and to the second end of the feedback resistive element, and wherein the noninverting input is coupled to ground, and wherein the output of the operational amplifier is coupled to the second end of the feed-forward resistive element.

8. The amplifier circuit of claim 7 wherein the output of the buffer can generate at least 25 watts peak of output power.

9. The amplifier circuit of claim 8 further comprising a correction limiting resistive element having a first end and a second end, wherein the first end of the correction limiting resistive element is coupled to the output of the voltage-to-current converter, and wherein the second end of the correction limiting resistive element is coupled to ground.

10. The amplifier circuit of claim 7 wherein the output of the buffer can generate at least 200 watts peak of output power.

11. The amplifier circuit of claim 10 wherein the −3 dB passband of the amplifier circuit includes 0.1 Hz.

12. An amplifier circuit comprising:
   an input node;
   a first voltage-to-current converter having an input and an output, wherein the input of the first voltage-to-current converter is coupled to the input node;
   a first current mirror having an input and an output, wherein the input of the first current mirror is coupled to the output of the first voltage-to-current converter;
   a second voltage-to-current converter having an input and an output, wherein the input of the second voltage-to-current converter is coupled to the input node;

a second current mirror having an input and an output, wherein the input of the second current mirror is coupled to the output of the second voltage-to-current converter;

an output buffer having a voltage input, a first current input, a second current input, and an output, wherein the first current input of the output buffer is coupled to the output of the first current mirror, and the second current input of the output buffer is coupled to the output of the second current mirror;

a feed-forward resistive element having a first end and a second end, wherein the first end of the feed-forward resistive element is coupled to the voltage input of the output buffer;

an input resistive element having a first end and a second end, wherein the first end of the input resistive element is coupled to the input node;

a feedback resistive element having a first end and a second end, wherein the first end of the feedback resistive element is coupled to the output of the output buffer; and an operational amplifier having an inverting input, a noninverting input, and an output, wherein the inverting input is coupled to the second end of the input resistive element and to the second end of the feedback resistive element, and wherein the noninverting input is coupled to ground, and wherein the output of the operational amplifier is coupled to the second end of the feed-forward resistive element.

13. The amplifier circuit of claim 12 further comprising an inverting input buffer amplifier having an input and an output, wherein the output of the inverting input buffer amplifier is coupled to the input node.

14. The amplifier circuit of claim 13 wherein the −3 dB passband of the amplifier circuit includes 15 Hz.

15. The amplifier circuit of claim 14 wherein the output of the output buffer can generate at least 100 watts peak of output power.

16. The amplifier circuit of claim 15 further comprising a correction limiting resistive element having a first end and a second end, wherein the first end of the correction limiting resistive element is coupled to the first end of the feed-forward resistive element, and wherein the second end of the correction limiting resistive element is coupled to ground.

17. The amplifier circuit of claim 12 wherein the buffer includes a first bias transistor, a second bias transistor, a first driver transistor, and a second driver transistor, and wherein the first current input of the buffer is coupled to the first bias transistor and to the first driver transistor, and wherein the second current input of the buffer is coupled to the second bias transistor and to the second driver transistor, and wherein the first bias transistor is physically attached to the first driver transistor, and wherein the second bias transistor is physically attached to the second driver transistor.

18. The amplifier circuit of claim 12 wherein the buffer includes a first bias transistor that has a collector, a second bias transistor that has a collector, a first driver transistor that has a base, and a second driver transistor that has a base, and wherein the first current input of the buffer is coupled to the collector of the first bias transistor and to the base of the first driver transistor, and wherein the second current input of the buffer is coupled to the collector of the second bias transistor and to the base of the second driver transistor, and wherein the first bias transistor is physically attached to the first driver transistor, and wherein the second bias transistor is physically attached to the second driver transistor.

19. A method for amplifying a voltage, the method comprising:

coupling an input voltage to an amplifier input;

generating a first current that is proportional to the input voltage;

generating a first voltage that is proportional to the first current;

coupling the amplifier input to an amplifier output through an input resistor coupled to a feedback resistor, wherein an end of the input resistor and an end of the feedback resistor are connected at an error amplifier input node;

generating an error amplifier input voltage at the error amplifier input node;

producing an error amplifier output voltage, wherein the error amplifier output voltage is proportional to the error amplifier input voltage;

adding the error amplifier output voltage to the first voltage; and producing an output voltage at the amplifier output, wherein the output voltage is substantially proportional to the sum of the error amplifier output voltage and the first voltage.

20. The method of claim 19, wherein:

the first voltage and the input voltage have opposite polarity; and the error amplifier input voltage and the error amplifier output voltage have opposite polarity.

21. A method for amplifying a voltage, the method comprising:

coupling an input voltage to an amplifier input;

generating a first current that is proportional to the input voltage;

generating a second current that is proportional to the input voltage, wherein the polarity of the first current is opposite to the polarity of the second current;

generating a first voltage that is substantially proportional to the first current minus the second current;

coupling the amplifier input to an amplifier output through an input resistor coupled to a feedback resistor, wherein an end of the input resistor and an end of the feedback resistor are connected at an error amplifier input node;

generating an error amplifier input voltage at the error amplifier input node;

producing an error amplifier output voltage, wherein the error amplifier output voltage is proportional to the error amplifier input voltage;

adding the error amplifier output voltage to the first voltage; and producing an output voltage at the amplifier output, wherein the output voltage is substantially proportional to the sum of the error amplifier output voltage and the first voltage.

22. The method of claim 21 further comprising:

generating a first intermediate current that is proportional to the input voltage, wherein the first intermediate current has a polarity that is opposite to the polarity of the first current; and generating a second intermediate current that is proportional to the input voltage, wherein the second intermediate current has a polarity that is opposite to the polarity of the second current.

23. The method of claim 22 further comprising inverting the input voltage prior to generating the first intermediate current and the second intermediate current.

24. A power amplifier, comprising:

a power amplifier input;

a power amplifier output;

means for generating a first current that is proportional to an input voltage;

means for generating a first voltage that is proportional to the first current;

means for coupling the power amplifier output to the power amplifier input, wherein the means for coupling the power amplifier output to the power amplifier input includes an error amplifier input node for producing an error amplifier input voltage;

means for producing an error amplifier output voltage, wherein the error amplifier output voltage is proportional to the error amplifier input voltage;

means for adding the error amplifier output voltage to the first voltage; and means for producing an output voltage at the power amplifier output, wherein the output voltage is substantially proportional to the sum of the error amplifier output voltage and the first voltage.

25. The power amplifier of claim 24 wherein the means for coupling the amplifier input to the amplifier output includes an input resistor coupled to a feedback resistor, wherein an end of the input resistor and an end of the feedback resistor are connected at the error amplifier input node.

26. A power amplifier, comprising:

a power amplifier input;

a power amplifier output;

means for generating a first current that is proportional to an input voltage at the power amplifier input;

means for generating a second current that is proportional to the input voltage, wherein the polarity of the first current is opposite to the polarity of the second current;

means for generating a first voltage that is proportional to the first current minus the second current;

means for coupling the power amplifier output to the power amplifier input, wherein the means for coupling the power amplifier output to the power amplifier input includes an error amplifier input node for generating an error amplifier input voltage;

means for producing an error amplifier output voltage, wherein the error amplifier output voltage is proportional to the error amplifier input voltage;

means for adding the error amplifier output voltage to the first voltage; and means for producing an output voltage at the power amplifier output, wherein the output voltage is substantially proportional to the sum of the error amplifier output voltage and the first voltage.

* * * * *